United States Patent [19]
Adair et al.

[11] Patent Number: 5,532,089
[45] Date of Patent: Jul. 2, 1996

[54] SIMPLIFIED FABRICATION METHODS FOR RIM PHASE-SHIFT MASKS

[75] Inventors: William J. Adair, Underhill, Vt.; Timothy A. Brunner, Ridgefield, Conn.; Derek B. Dove, Mt. Kisco; Louis L. Hsu, Fishkill, both of N.Y.; Chi-Min Yuan, Austin, Tex.

[73] Assignee: International Business Machines Corporation, Armonk, N.Y.

[21] Appl. No.: 173,383

[22] Filed: Dec. 23, 1993

[51] Int. Cl.$^6$ .................................................. G03F 9/00
[52] U.S. Cl. .......................... 430/5; 430/313; 430/314; 430/322; 430/323; 156/643.1; 156/644.1; 156/646.1; 156/653.1; 428/137
[58] Field of Search ............................ 430/5, 313, 314, 430/322, 323; 428/137; 156/643, 644, 646, 653

[56] References Cited

U.S. PATENT DOCUMENTS

| | | | |
|---|---|---|---|
| 4,707,218 | 11/1987 | Giammarco et al. | 156/643 |
| 4,923,772 | 5/1990 | Kirch et al. | 430/5 |
| 4,937,129 | 6/1990 | Yamazaki | 428/195 |
| 5,045,417 | 9/1991 | Okamoto | 430/5 |
| 5,194,345 | 3/1993 | Rolfsen | 430/5 |
| 5,262,282 | 11/1993 | Hieda et al. | 430/323 |
| 5,276,551 | 1/1994 | Nakagawa | 430/5 |

OTHER PUBLICATIONS

"Methods for Manufacturing Self–Aligning Phase–Shift Masks"; S. P. Bajuk et al.; Research Disclosure, Feb. 1992, No. 334, Kenneth Mason Publications Ltd, England.

"New Phase Shifting Mask with Self–aligned Phase Shifters for a Quarter Micron Photolithography"; Akihiro Nitayama et al.; Toshiba Corporation; ULSI Research Center; IEEE Sep. 1989; pp. 3.3.1 through 3.3.4.

*Primary Examiner*—S. Rosasco
*Attorney, Agent, or Firm*—Whitham, Curtis, Whitham & McGinn; Eric W. Petraske

[57] ABSTRACT

A simplified method of forming a phase shift structure for a lithographic mask includes the conformal deposition of a phase shift material, preferably having an index of refraction similar to that of the mask substrate, over a patterned layer of opaque material and exposed areas of the mask substrate corresponding to the pattern. The thickness of the opaque patterned layer, in combination with the conformal deposition preferably establishes a differentially altered optical path length to produce a phase shift which enhances contrast and increases illumination and resolution in fine patterns. In variant forms of the invention, the conformal deposition of either phase shift material or a sidewall spacer material is followed by an anisotropic removal of material to form the phase shift structure. The application of phase shift material over the mask surface increases durability of the mask and also enhances contrast of images produced with other phase-shift mask feature structures, such as Levenson-type shifters.

16 Claims, 12 Drawing Sheets

SIMPLIFIED FABRICATION METHODS FOR RIM PHASE-SHIFT MASKS

BACKGROUND OF THE INVENTION

1. Field of the Invention

The present invention generally relates to high resolution photolithography and, more particularly, to improved fabrication methods for high performance masks for use therein.

2. Description of the Prior Art

The formation of fine patterns of conductors and other portions of circuit elements is an indispensable part of the fabrication of integrated circuits and other electronic devices, such as multi-layer modular circuits which may contain many such integrated circuits and other devices which are connected by conductive patterns on lamina thereof. Photolithography techniques are well-known and highly developed for the production of such patterns. In general, photolithography involves the application of a photosensitive resist material to a surface of a lamina, substrate or partially formed integrated circuit and the exposure of a portion of the photosensitive resist material in accordance with a desired pattern. The pattern is then developed by selective removal of either the exposed or unexposed portion of the resist (depending on whether the resist material is a positive or a negative resist) allowing material to be selectively removed or deposited in accordance with the remaining pattern of resist material.

The exposure of the photoresist material is often accomplished by the projection of light or other radiation (e.g. at ultra-violet and shorter wavelengths) through a mask since a mask permits a high degree of accuracy, repeatability and convenience as compared to direct writing of the pattern. The quality of the mask therefore determines and limits the quality of the developed pattern of resist material. While very high quality mask patterns have been developed, however, some optical effects have further limited resist exposure quality.

Specifically, due to the wave-like nature of light and other forms of radiation suitable for photolithography processes, diffraction and other interference effects occur at the edges of opaque areas of the mask and may cause a dimensional change (or produce ghost patterns) in the exposed pattern since the opaque regions of the mask cannot be placed directly in contact with the photo resist during exposure. In practice, it is customary to project the image using an optical system of substantial length in order to achieve a reduction of the size of the pattern at the resist surface relative to the size of the mask. These effects therefore cause some spreading of the exposed image or even the exposure of additional regions of the photoresist corresponding to lobes of energy radiating at an angle to the plane of the mask from an aperture therein, depending on the separation of the opaque regions of the mask from the photoresist (e.g. the distance over which the pattern image is projected).

While this effect is generally dimensionally small, recent increases in integration density of integrated circuits has pushed minimum feature sizes of patterns into regimes where the effect has become significant and often critical to high manufacturing yields. Therefore, to improve exposure patterns, a so-called rim phase-shift mask has been developed in order to limit image spreading in exposure of features of closed shape. A similar phase-shift mask formation known as a Levenson-type shifter is used for exposure of periodically repeated patterns, such as arrays of parallel conductors.

Essentially such rim phase-shift masks provide an altered optical path length through the mask at the edge or rim of the opaque pattern formed in the mask. A Levenson-type phase shift structure provides a similar effect with differing path lengths between opaque regions which enhances contrast of repeated patterns, such as parallel lines. The difference in path length provides a 180° phase shift of the radiation at the wavelength at which the exposure is made. This phase shift causes an interference effect which slightly narrows the exposure pattern at the photoresist surface relative to the size of an aperture formed in the mask and reduces the intensity of radiation beyond the edges of the aperture (e.g. the energy in the side lobes) such that any exposure which occurs beyond the dimensions of the mask aperture is insufficient to be developed.

While rim phase-shift masks have been made and effectively used, the fabrication of the masks has been difficult and expensive due to the need to form extremely small regions having differing optical lengths at the edges of opaque regions. That is, either patterning must be done within the mask pattern or the opaque regions of the mask must be recessed from the regions of differing optical path length.

For example, one known technique, which will be discussed in greater detail below, involves selective etching of the mask substrate in addition to the etching of the mask pattern. This requires two separate exposure and development operations which are therefore impossible to conduct in a self-aligned manner, thus increasing expense and increasing the likelihood of production of a defective mask. Further, the requirement for forming a pattern within another pattern limits the minimum feature size which can be exposed by such masks. For example, to form a 0.4 µm exposure spot using a 4× mask (e.g. the mask is formed at four times the size of the desired image in each coordinate direction), it is preferred to provide phase shift regions of about 0.5 µm in addition to the 1.6 µm clear aperture. Therefore, even with optical reduction in size of the exposure pattern defined by the mask, a comparable level of photolithographic technology is still necessary to form the mask. By the same token, the size of openings in opaque regions in the mask are increased and spacing between exposed regions cannot be reduced to exploit the full capability of the currently available photolithographic technology in terms of integration density of the final product.

Another known technique which will also be discussed in greater detail below, involves exposure of a phase shift material (e.g. a thickness of material having similar index of refraction to the mask substrate and of a thickness to provide the desired phase shift of radiation passing therethrough), which is also a photoresist, from the rear surface of the mask in order to form the required pattern of phase shift material. While this exposure can be considered to be self-aligned, the opaque material of the mask must then be undercut by an etching process which may not be accurately controllable. That is, the final pattern of opaque material (e.g. chromium) will not have been directly formed in accordance with a desired final pattern and difficulty of control of the recess distance and the sidewall profile of the opaque material may cause undesired variation from the intended final pattern or result in the formation of a defective mask.

In regard to either of these techniques, it should be noted that many patterns and most interconnetion patterns which are used in the production of integrated circuits will include both repeated patterns of features such as parallel conductors as well as closed features such as pads. Heretofore, the process steps required for Levenson-type phase shift structures was sufficiently incompatible with the formation of rim phase shift structures that separate alignment, exposure development and etch steps were required for the respective structures. Therefore, increased costs and reduced manufacturing yields resulted because of the additional alignment steps and the additional process steps required.

In summary, known techniques for fabricating masks including rim phase-shift structures require some operations that inherently carry a risk that a defective mask will be formed. Further, all known techniques limit the resolution which can be achieved in the final product formed with the mask below the resolution which can be produced at the current state of the photolithographic art as well as requiring numerous and expensive steps for mask fabrication.

SUMMARY OF THE INVENTION

It is therefore an object of the present invention to provide alternative techniques for fine phase-shift mask fabrication which are of reduced expense and improved fabrication yield.

It is another object of the invention to provide rim phase-shift mask techniques which avoid or reduce limitation on the feature size of an image which can be produced therewith relative to the minimum feature size required for mask production.

It is a further object of the invention to provide a process by which rim phase-shift mask features and Levenson-type phase-shift structures can be formed on the same mask by at least partially concurrent processes.

In order to accomplish these and other objects of the invention, a method is provided for fabricating a lithography exposure mask for exposing at least one area and including at least one feature including at least one phase shift region adjacent an opaque region of the mask, including the steps of patterning a layer of opaque material deposited on a substrate in accordance with a feature corresponding in size to the area and the phase shift region, and conformally depositing a phase shift material or a sidewall spacer material over said opaque material and said substrate.

In accordance with another aspect of the invention, a phase-shift lithography mask for projecting at least one image area onto a resist material including a substrate which is substantially transparent to electromagnetic radiation having a desired wavelength and which has a first refractive index, a pattern of opaque material deposited on the substrate and having openings therein exposing the substrate and at least one of the substrate and a layer of phase shift material which is substantially transparent to electromagnetic radiation having said desired wavelength and which has a second refractive index substantially equal to the first refractive index, said layer of phase shift material being deposited on said substrate within said openings, including a feature corresponding in size to the image area.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
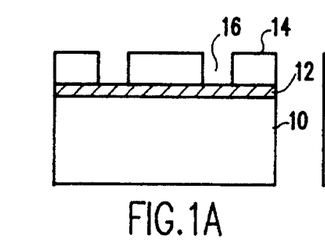
FIGS. 1a, 1b, 1c, 1d, and 1e illustrate major steps in one known rim phase-shift mask fabrication method.
Figure 1B:
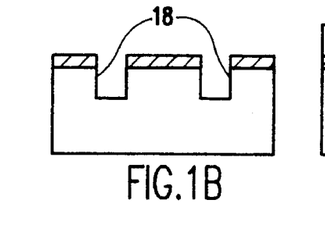
Figure 1C:
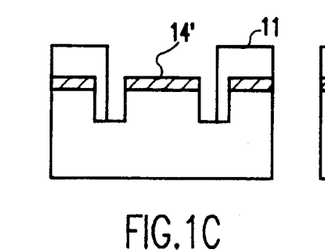
Figure 1D:
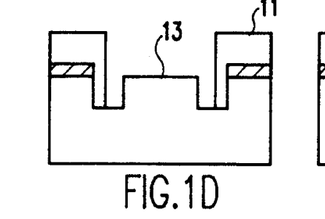
Figure 1E:
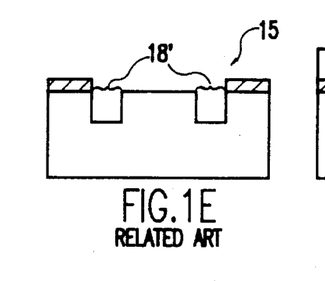

Referring now to the drawings, and more particularly to FIGS. 1a–1e, there are shown the major steps in a fabrication process for a rim phase-shift mask which is known to the inventors of the present invention. A representative portion of the completed mask is shown in FIG. 1e. It is to be understood, however, that while this process and mask structure and that of FIGS. 2a–2e are referred to as "known" in order to differentiate them from the present invention, no admission is made that any subject matter shown in these Figures is prior art as to the present invention.

FIG. 1a shows an early stage of the fabrication of a rim phase-shift mask structure in accordance with the first known fabrication method discussed briefly above as background of the invention. At the stage of fabrication shown in FIG. 1a, a blanket layer 12 of opaque material, such as chrome has been deposited on a quartz or glass mask substrate 10 followed by a resist layer 14 which has been patterned at apertures 16 in order to etch through the opaque layer and to form depressions 18 in the quartz substrate to a depth to achieve the desired phase shift (e.g. by reducing the relative thickness of material having a known index of refraction to shorten the optical path length by an odd multiple of one-half the wavelength of the intended exposure radiation wavelength in the substrate material) as shown in FIG. 1b. This depth is preferably about 230 nm for a substrate having a refractive index of about 1.5 and assuming that the exposure radiation wavelength is in the deep ultra-violet range.

One major drawback of this known mask feature design is that there is no control on the depth of the etch. Further, the uniformity of the etching process at the current level of technology is about ±5% of the etch depth (which determines the amount of phase shift which will be achieved). Therefore, these two sources of potential variation of etch depth can result in substantial potential reduction of manufacturing yield and severely reduce the confidence that an acceptable mask will be produced in any given production process sequence for production of this design.

Next, as shown in FIG. 1c, a further blanket resist layer 11 is applied and patterned to enable selective etching of the portion of the opaque material pattern remaining in the mask aperture to form the structure shown in FIG. 1d. (The opaque material will hereinafter sometimes be referred to by the preferred exemplary chrome material although it is to be understood that other materials, such as a composite of chrome or other metal applied over a nitride layer, may be used and may be preferable in some circumstances. For example, a relatively thick layer of chrome may result in increased stress in the mask which can be avoided by choice of alternate materials.) It should be noted that while the minimum feature size of this patterning operation is not as small as in the patterning required to produce the structure of FIG. 1a, the alignment accuracy and feature size tolerance are even smaller and cannot be performed by a self-aligned process. Further, the resist must penetrate the depressions formed by the etching step resulting in the structure 1b and which cannot be reliably achieved.

Finally, resist 11 is removed to yield the finished rim phase-shift mask feature 15. It should be noted, by way of contrast to the rim phase-shift mask feature which will be discussed below with reference to FIGS. 2a–2e, that mask 15 is a relatively high performance mask since the transparency at any location within the mask aperture is the same as or better than (in the phase-shift regions 18') the transparency of the substrate and no additional optical boundaries are formed which may be partially reflective. Therefore, this mask feature, if correctly formed, can be considered as a performance standard for comparison with the present invention as will be discussed in detail below.

Figure 2A:
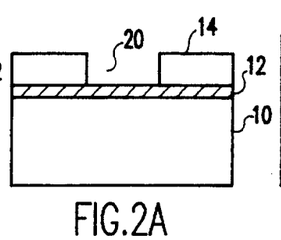
FIGS. 2a, 2b, 2c, 2d, and 2e illustrate major steps in another known rim phase-shift mask fabrication method.
Figures 2B, 3B:
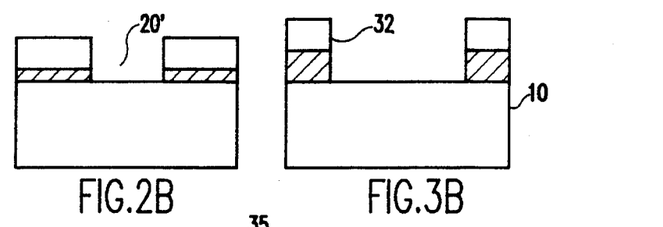
FIGS. 3a, 3b and 3c illustrate fabrication of a rim phase-shift mask in accordance with the invention.

Referring now to FIGS. 2a–2e, a second known form of rim phase-shift mask feature will be discussed. (In the remainder of FIGS. 2a–5e, common reference numerals are used insofar as is possible. Further, in the interest of clarity, all of FIGS. 1a–5e are drawn to a common size and with features, such as the central portion of the aperture and the phase-shift regions similarly located in the horizontal direction and similarly sized. However, none of these Figures should be considered as being drawn to scale referenced to the mask feature since vertical and horizontal dimensions thereof can be changed at will, based on numerous considerations, such as exposure radiation wavelength, which will be evident to those skilled in the art in view of the present description.) FIG. 2a shows a comparable stage of fabrication of the mask as shown in FIG. 1a. That is, a blanket layer 12 of chrome or other opaque material has been deposited on substrate 10 and covered with a resist layer which has been patterned. However, in this example, the resist has been patterned (at 20) to correspond to the central area of the feature, exclusive of the phase-shift regions. The chrome layer in this region 20' is then etched as shown in FIG. 2b.

Figures 2C, 3C:
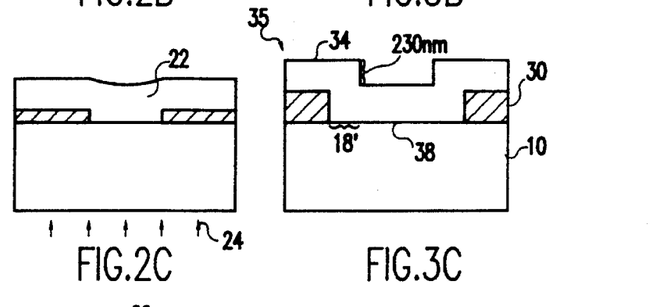
Figure 2D:
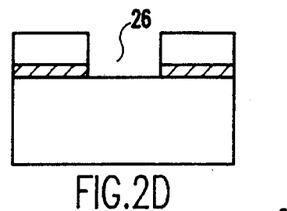

Following the etch of the chrome layer, resist layer 14 is removed and another blanket layer of resist 22 is applied, as shown in FIG. 2c. In this example, the resist material is PMMA (poly-methyl-methacrylate) which is critical to this example. PMMA is comparably transparent to the transparency of the substrate at ultraviolet wavelengths and has approximately the same refractive index. In this example, a portion of resist layer 22 remains in the completed device and forms an optical element thereof. Therefore, the thickness of the resist is also critical to this example and accuracy of thickness is somewhat difficult to achieve.

To form the inner boundary of the phase shift regions the resist is then exposed by radiation from the back side of the mask, as indicated by arrows 24 in FIG. 2c. Development of this exposure causes removal of the resist at 26 of FIG. 2d. The remainder of the phase-shift regions 18' is then formed by a lateral etch of the chrome at 28 leaving an overhanging region of resist. As indicated above, while the exposure of resist 22 is a self-aligned process, the lateral etch of chrome layer 12 is not terminated or conducted in accordance with any pattern other than the initial pattern of the central portion of the mask aperture. Therefore, width of the phase-shift region cannot be accurately sized except by inspection and the outer boundary of the mask feature will generally be somewhat irregular. Width of the phase-shift region may also vary from feature to feature as well as within the same feature.

Figure 2E:
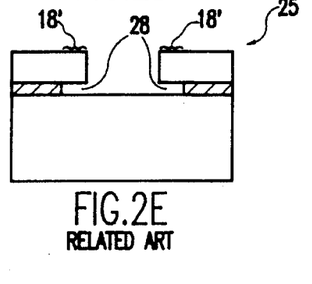

Further, relative to the mask feature 15 of FIG. 1e, the transparency of the phase-shift regions 18' of mask feature 25 of FIG. 2e is reduced because of the additional two boundaries which are formed. The transparency may be further affected by interference effects if the chrome layer is thin or certain fractions of a wavelength of the radiation used for the lithographic exposure. The phase shift obtained is also less than optimally regulated since the thickness of the resist is not readily regulated. For example, the resist may be in the form of a paste which contains solvents and is thus subject to shrinkage. Further, the structure is not robust due both to the cantilevered overhang of the phase-shift material and the softness of the PMMA resist which is more subject to scratching and other physical damage.

In sharp contrast to both of the above examples, the preferred embodiment of a rim phase-shift mask feature in accordance with the invention is shown in FIG. 3c. In this preferred embodiment of the invention, the layer 30 of opaque material is depicted as being substantially thicker (and the use of chrome correspondingly less desireable, as discussed above) than in the two examples of known rim phase-shift mask feature discussed above which will usually, but not necessarily, be the case. In fact, the thickness of the chrome layers of the two previously discussed examples is arbitrary whereas in the preferred embodiment of the invention, the thickness of the opaque material layer establishes the phase shift optical path length difference. Additionally, the width of the phase-shift regions 18' can be readily controlled. Only a single additional boundary is formed and this boundary is of little effect under preferred conditions of manufacture where the index of refraction of the deposited material will preferably closely match that of the substrate. Further, only a single patterning operation is required.

Figure 3A:
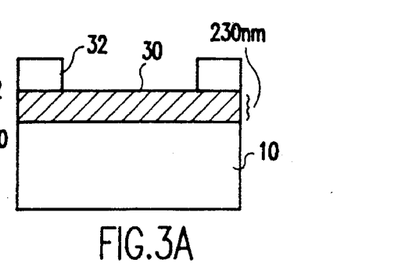

More specifically, a point in the fabrication comparable to that of FIGS. 1a and 2a is shown in FIG. 3a. That is, a layer 30 of opaque material has been deposited to a desired thickness (e.g. 230 nm for deep ultraviolet), equal to or approximating the optical path length difference for 180° phase shift, has been deposited on substrate 10 and a resist 32 has been applied thereover and patterned. The thickness is dependent on both imaging wavelength and, to a lesser extent, on the feature size to be imaged and may be ranged from about 120 nm to about 300 nm.

It should be noted that, in contrast to the patterning in FIGS. 1a and 2a, the pattern feature is the full aperture size inclusive of the phase shift regions. Therefore the exposure image made by the mask feature will be even smaller than the aperture even before further reduction by an optical system, as discussed above. Therefore, manufacturing constraints are eased and high quality patterning can be readily achieved. By way of comparison, the minimum feature size of the mask of FIG. 3a is several times larger than the minimum feature size which must be produced for the same patterning operation of the example of FIG. 1a. Compared to the example of FIG. 2a, the minimum feature size is larger by twice the width of each of the phase-shift regions.

Therefore, an additional benefit of the present invention in addition to accomplishing the objects stated above is that the invention can be used to make high quality exposures of mask features at incrementally smaller sizes in order to achieve extremely small features. This process of producing smaller features by using the mask to make another mask is limited, in theory, only by the wavelength used for the ultimate exposure of a resist on a wafer since the thickness of opaque material deposition can be readily controlled with sufficient accuracy, particularly in comparison to etching, to distances corresponding to very short wavelengths.

As in the two previously discussed examples, the resist pattern is now used to pattern the opaque material (e.g. a chrome/nitride composite) layer, preferably by anisotropic reactive ion etch (RIE) which can produce very steep sidewalls in the pattern being formed in the chrome layer, resulting in the structure shown in FIG. 3b. However, it is now sufficient to complete the rim phase-shift mask feature 35 in accordance with the preferred embodiment of the invention to conformally deposit (e.g. by chemical vapor deposition (CVD) or other suitable process, such as sputtering) a layer of material 34 having approximately the same index of refraction as the mask substrate 10. The similarly of refractive indices results in minimal reflection from boundary 38 and the transparency of the mask is only reduced very slightly due to the additional thickness of material. Since the deposit of material is conformal, the width of the phase-shift region 18' grows during deposition and the thickness of the deposition is not critical to the accuracy of the phase shift obtained since the difference in optical path length is determined by the thickness of the chrome layer (indicated by a bracket and the legend "230 nm" in FIG. 3c). Therefore, the effects of the phase-shift regions may be determined by inspection (e.g. projection through the aperture) and can be adjusted, if desired or necessary, by conformal etching or further conformal deposition until adequately optimal results are obtained. It should also be noted that conformal deposition proceeds far more regularly and predictably than lateral etching of chrome or other opaque materials in the example of FIG. 2e. Clearly such dimensional adjustment is impossible in the example of FIG. 1e since the dimensions of the phase-shift regions 18' are fixed by the first patterning step.

Thus it is seen that the methodology and structure in accordance with the invention provides a simpler manufacturing process than those previously known and produces a mask feature which can be adjusted to obtain near-optimal imaging quality. Neither alignment tolerance nor minimum feature size is smaller (allowing for further optical size reduction) than the feature to be produced. The steps of the manufacturing methodology in accordance with the invention further have inherently high manufacturing yields. The reduced number of steps reduces costs. Additionally, the chrome deposits are covered and protected by the conformally deposited material which is advantageously the same as that of the substrate (e.g. $SiO_2$, quartz or glass) and the mask pattern is effectively encapsulated. The structure is robust both because of protection of the chrome layer pattern and the lack of requirement for etching of the substrate.

The principles of the preferred embodiment of the invention may be applied to variant forms of the invention which will now be discussed. These additional embodiments are to be considered as exemplary and indicative of the degree of variation with which rim phase-shift mask features and other structures employing phase shift can be fabricated within the spirit and scope of the invention. While not possessing all of the advantages of the preferred embodiment, the variation of the invention discussed below possess advantages in comparison with the examples of known rim phase-shift mask features discussed above.

Figure 4A:
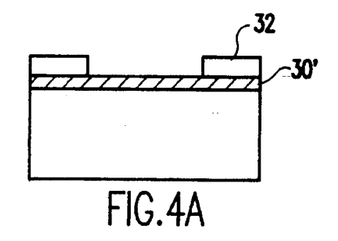
FIGS. 4a, 4b, 4c, 4d, and 4e illustrate an alternative method for fabrication of a rim phase-shift mask in accordance with the invention.

For example, referring to FIG. 4a, a structure comparable to that of FIG. 3a is shown. However, the opaque material layer 30' is depicted as being relatively thin and, in this embodiment of the invention, need not be deposited to any particular wavelength and/or feature size dependent thickness. (Accordingly, chrome is preferred as an opaque material.) It is only necessary for the opaque material layer 30' to be of sufficient thickness to cause formation of a sidewall adjacent the chrome and extending over the substrate in the phase-shift region. Nevertheless, the patterning of resist layer 32 corresponds to the entire mask aperture inclusive of the phase shift region and the advantages discussed above in regard to minimum feature size and maintained.

Figure 4B:
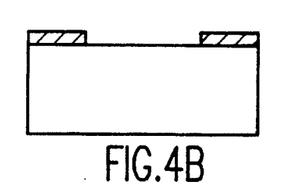
Figure 4C:
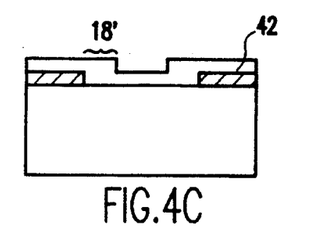
Figure 4D:
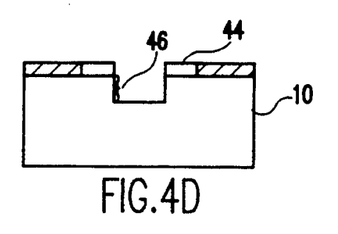
Figure 4E:
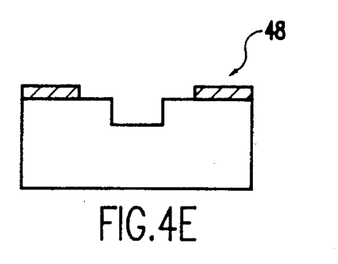

More specifically, once chrome layer 30' is patterned and resist 32 removed to result in the structure of FIG. 4b, a layer of sidewall spacer material, such as plasma deposited nitride, which can be etched at a different, slower, rate than either the substrate material or chrome (or other opaque mask material) is deposited in a generally conformal manner by CVD, forming regions 18' of increased thickness adjacent the chromium, as is readily evident in FIG. 4c. This layer (42) is then opened by anisotropic etching which removes the spacer material at the central portion of the aperture and over the chrome pattern, leaving sidewall spacers 44, as shown in FIG. 4d. Then the substrate 10 is selectively etched to a phase shift depth 46 (e.g. 230 nm for deep ultraviolet) in a self-aligned manner. Finally, the sidewall spacers can be removed to yield the completed mask feature 48, as shown in FIG. 4e.

A further variant form of the invention will now be described with reference to FIGS. 5a–5e. The structure shown and the fabrication steps shown in FIGS. 5a and 5b differ from FIGS. 4a and 4b only by the inclusion of an etch stop layer 52 of, for example, aluminum oxide or hafnium oxide. This layer forms a pair of interfaces at which some reflection will unavoidably occur due to a mismatch of refractive indices and this variant of the invention is not generally preferred for that reason. Nevertheless, this variant of the invention retains some advantages in regard to feature sizes, manufacturing tolerances and robustness and may be preferable in some circumstances.

Figure 5A:
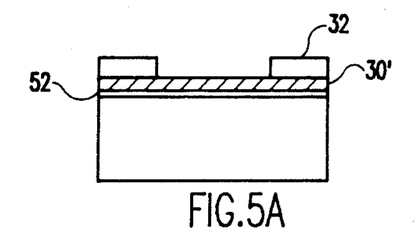
FIGS. 5a, 5b, 5c, 5d, and 5e illustrate another alternative method for fabrication of a rim phase-shift mask in accordance with the invention.
Figure 5B:
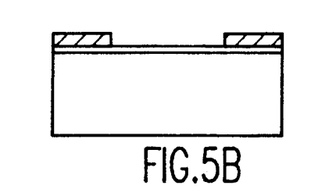
Figure 5C:
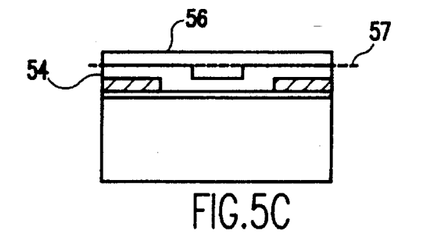
Figure 5D:
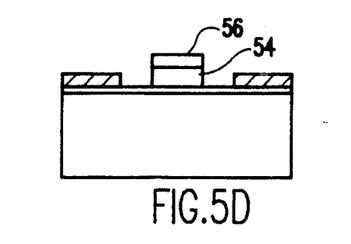
Figure 5E:
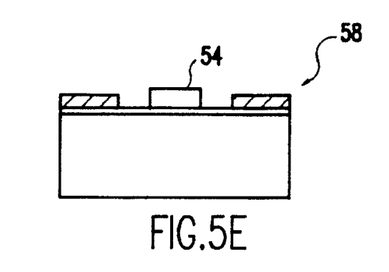

Specifically, and with reference to FIG. 5c, after patterning of the chrome layer as described above, a layer 54 of material having a refractive index approximating that of the mask substrate material is applied to an appropriate depth to obtain 180° phase shift of the exposure radiation wavelength. This layer (54) is followed by a blanket layer 56 of planarizing material such as a photoresist, polyimide or spin on glass (SOG) which is patterned to cover the central regions or portions of the apertures. While this patterning could be done by a further exposure of a radiation sensitive resist, such patterning would not be a self-aligned process. Nevertheless, the minimum feature size is several times larger than that used to form the phase shift regions of the example of FIGS. 1a–1e. However, since the oxide layer 54 is preferably conformally deposited, the resist layer may also be patterned by planarization to plane 57 and, in the preferred method for fabricating this variant form of the invention, no second exposure or non-self-aligned step is actually required. The phase shift material layer 54 is then anisotropically etched to etch stop layer 52 in accordance with the patterned resist 56 as shown in FIG. 5d and the completed mask feature structure 58 is completed by removal of the remaining resist 56 as shown in FIG. 5e.

It has also been discovered by the inventors that the optical properties of the preferred embodiment of the invention may be used to enhance other types of mask features using phase shift regions for forming other than closed shapes. In particular, it has been found that application of a conformal coating of phase shift material to a Levenson-type phase shifter pattern will enhance the contrast of grating patterns (e.g. a repeated pattern of lines and spaces) will be significantly enhanced. This conformal coating of phase shift material can effectively be retrofit to an existing mask which includes other phase shift structures and can be done in the same operation in which rim phase-shift structures are formed at other isolated apertures in the mask.

Figure 6A:
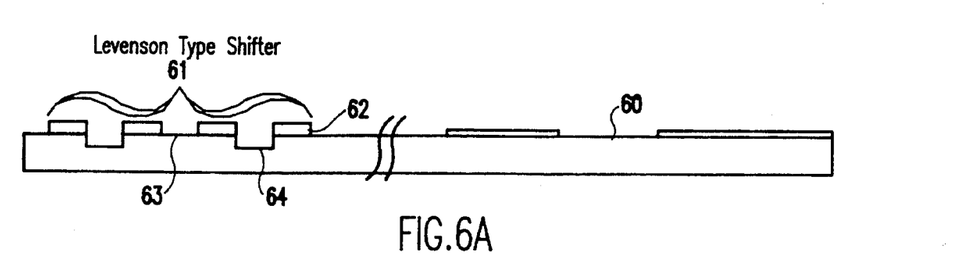
FIGS. 6a and 6b illustrate application of the invention to masks which include Levenson-type shifters.

Referring now to FIG. 6a, a mask including at least one aperture 60 and a Levenson-type phase shifter 61 is shown. As is known, a Levenson-type phase shifter 61 includes regions of opaque material 62 which are alternately separated by etched 64 and unetched 63 portions of the mask substrate. This type of structure produces an interference pattern of parallel lines with enhanced exposure intensity at the edges of the lines. In regard to aperture 60, it will be recognized that the structure is the same as that illustrated in FIGS. 3b, 4b and 5b and any of the rim phase-shift structures in accordance with the invention and described above may be formed therein in accordance with the invention. It should also be recognized that the spaces between opaque pattern portions 62 of the Levenson-type phase shifter are also apertures in section and, since a meritorious characteristic of all the variant forms of the invention is that all process steps are aligned to the opaque pattern, any variant form of the invention could, in theory be formed in the spaces between opaque regions 62 of the Levenson-type phase shifter structure.

Therefore, using the preferred embodiment of the invention as an example, a layer 65 of phase-shift material can be conformally deposited directly on the existing mask structure of FIG. 6a to simultaneously form a rim phase-shift feature 35 at aperture 60 and to form a contrast enhancing structure on the Levenson-type phase shifter 61.

Figure 7:
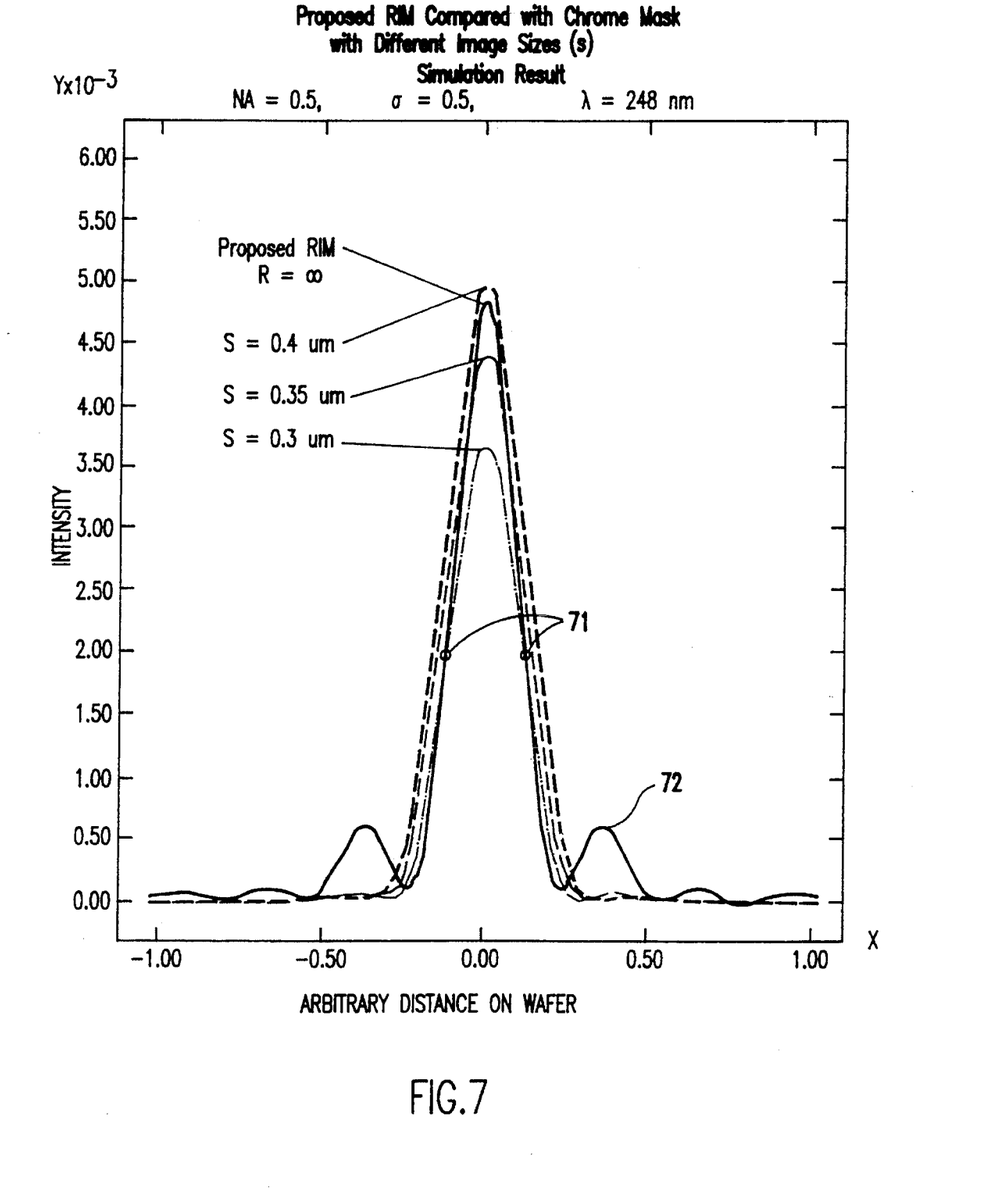
FIGS. 7, 8, 9, 10, 11, 12, 13, and 14 show a graph of simulated radiation intensity distributions.
Figure 8:
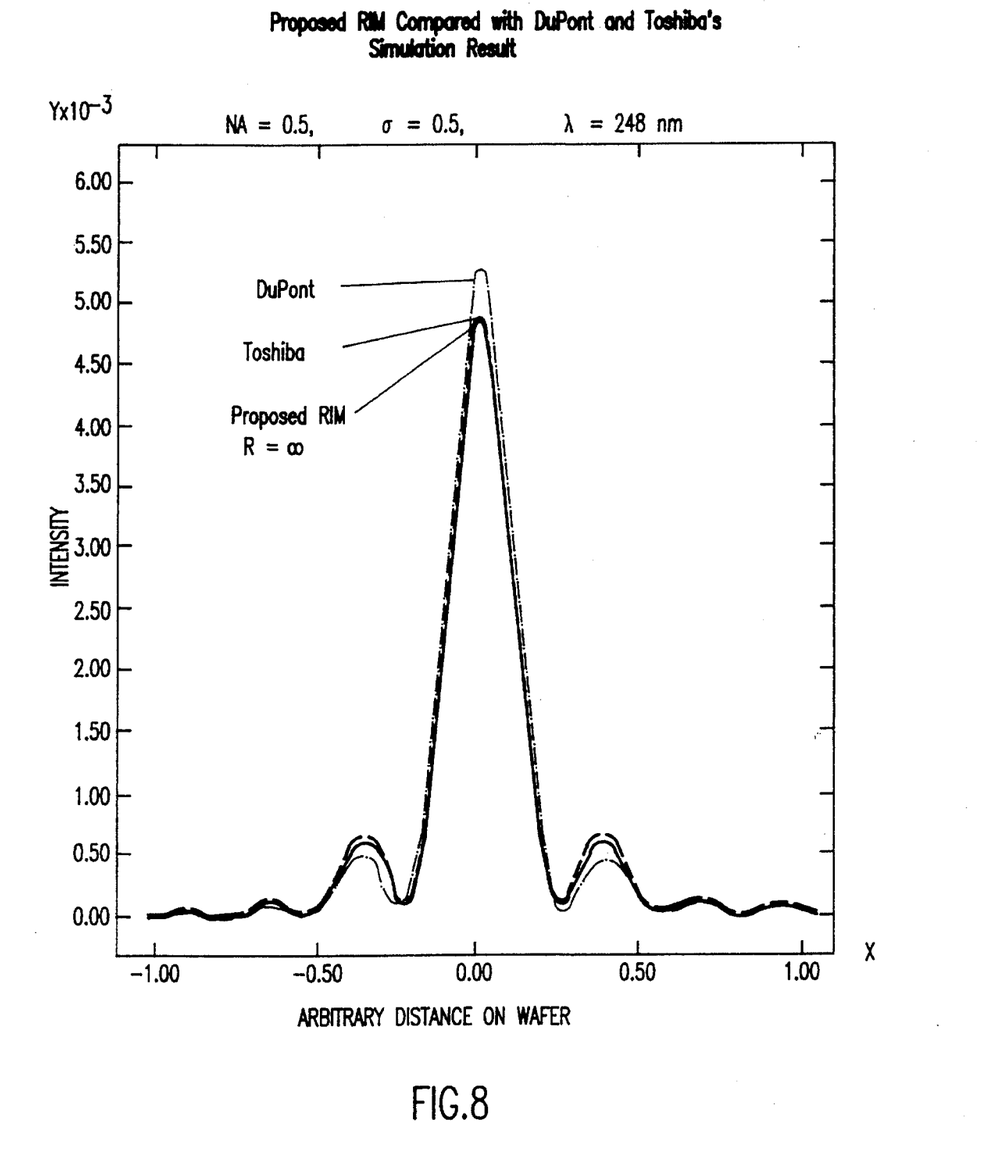

To demonstrate the efficacy of the mask feature in accordance with the invention, FIGS. 7 and 8 respectively show the results of simulations of comparisons with chrome-on-glass (COG) mask features (e.g. without phase shift structures) and the known examples of rim phase-shift structures of FIGS. 1e and 2e. In FIG. 7, the intensity profile produced by the rim phase shift structure in accordance with the invention is shown in solid line compared to different aperture sizes corresponding to different feature sizes, S, referred to the surface on a resist exposed therewith. It is clearly seen that the intensity profile produced by the invention is more steeply sloped than the profiles produced by the COG apertures. However, the more important result of this simulation is seen at the intersection points 71 of the profile corresponding to the present invention and the S=0.3 μm curve which shows that for a relative threshold exposure intensity $Y=2.00\times10^{-3}$ (which is unitless) which differentiates developable and undevelopable areas of the resist, the invention can provide the same resolution as an extremely small aperture but with greatly increased intensity within the aperture. It should also be noted with regard to FIG. 7 and other Figures illustrating simulations of the performance of the invention that the side lobes 72 are small and well below any exposure threshold which is of practical significance.

Referring now to FIG. 8, the performance of the rim phase-shift structure in accordance with the invention is compared to the performance of the known structures of FIGS. 1e and 2e. It is readily seen that the performance of the present invention does not differ significantly from either, yielding slightly improved resolution with only slight loss of intensity compared to the example of FIG. 1e while having the additional benefit of an inexpensive process which is inherently low in defects and allowing much larger minimum feature sizes. The performance of the invention is nearly identical to that of the example of FIG. 2e but produced with a far more robust and durable structure fabricated at reduced cost, increased manufacturing yield and improved control of pattern edge profile and aperture shape.

Figure 6B:
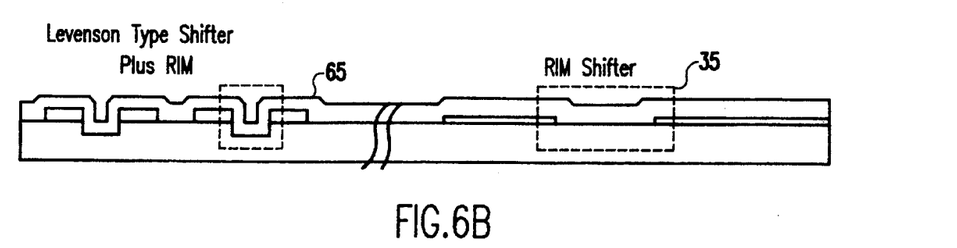
Figure 6C:
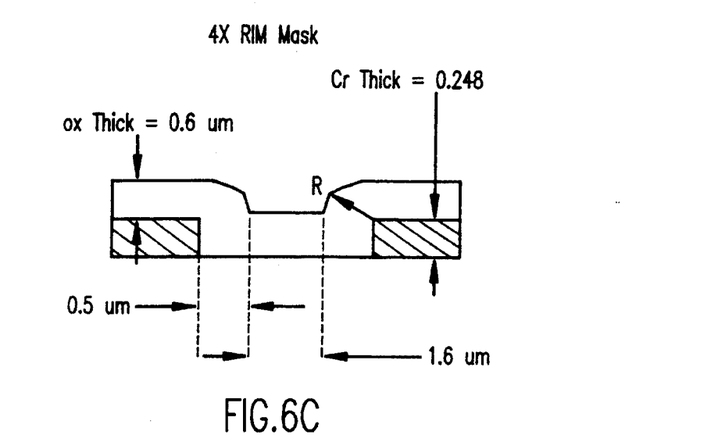
FIG. 6c shows an exemplary cross-sectional view of the preferred form of the invention sized to form a 0.35 μm exposure feature.
Figure 9:
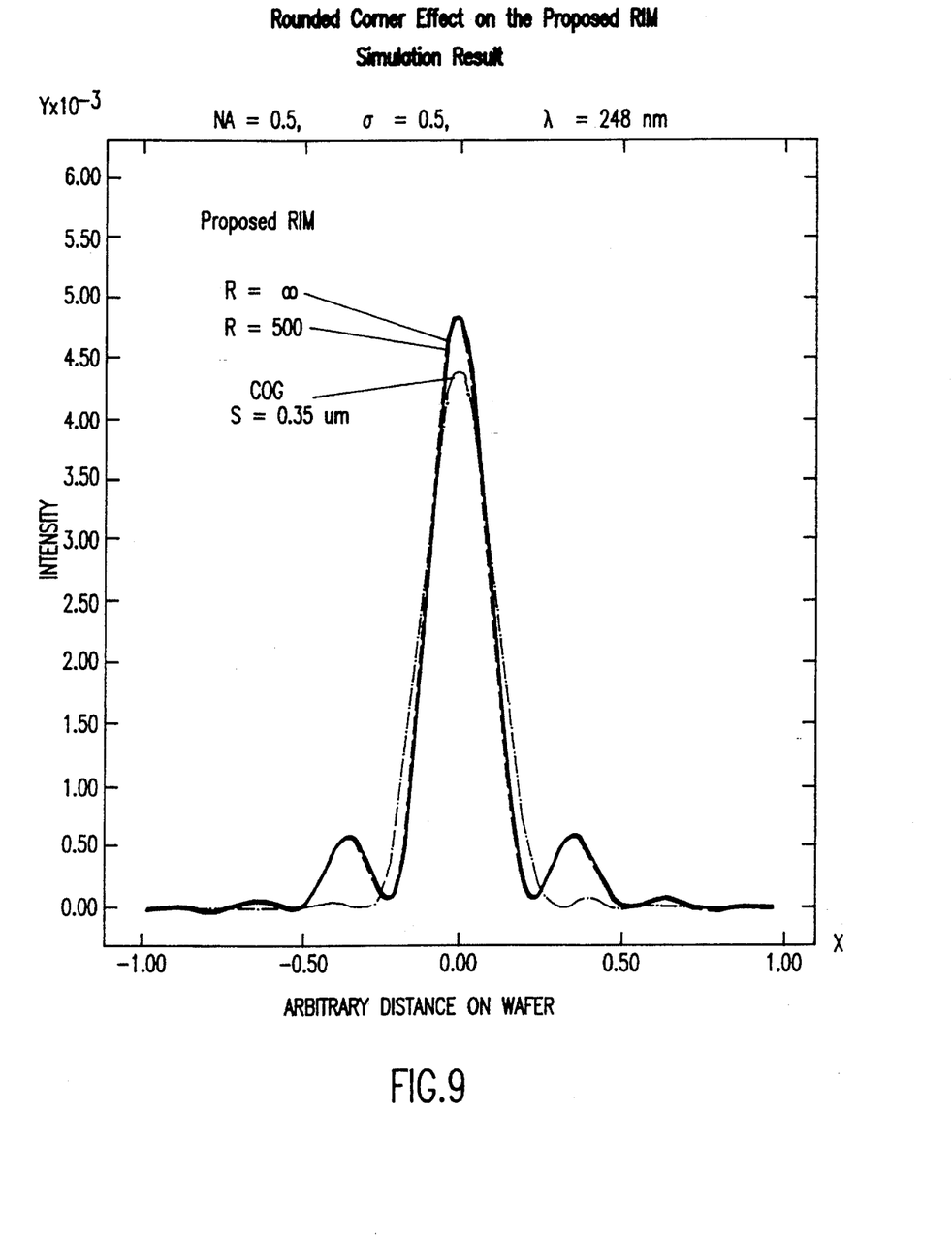
Figure 10:
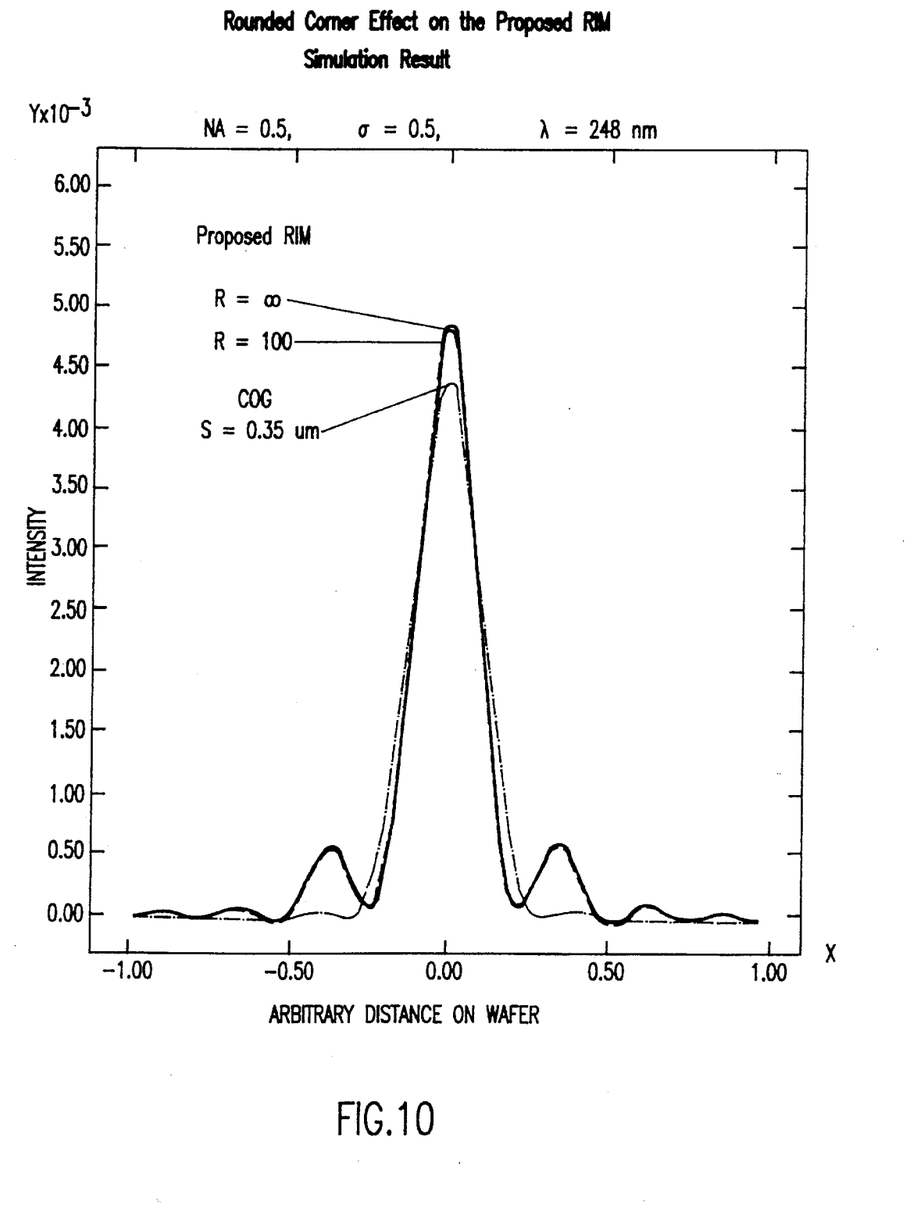
Figure 11:
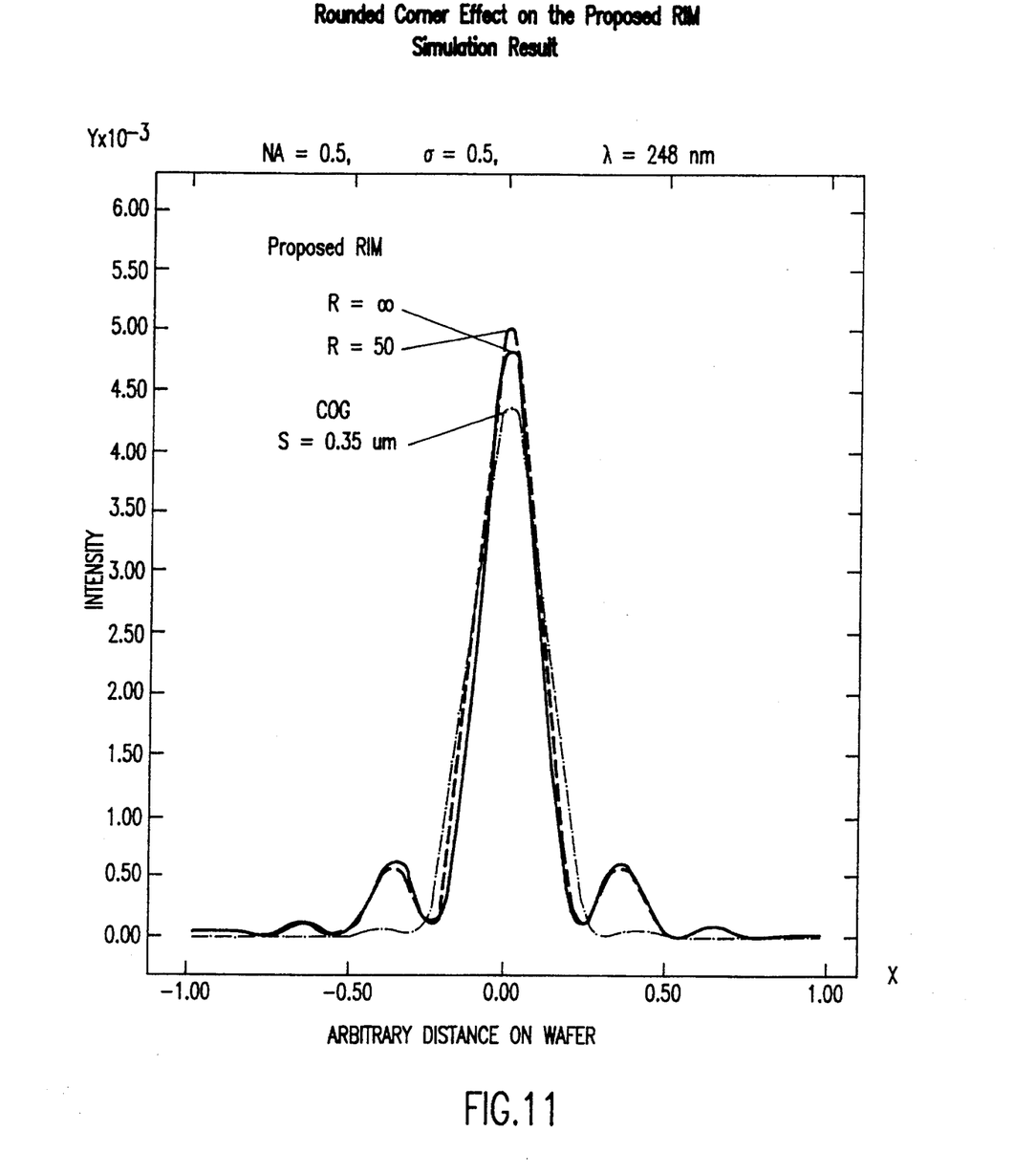
Figure 12:
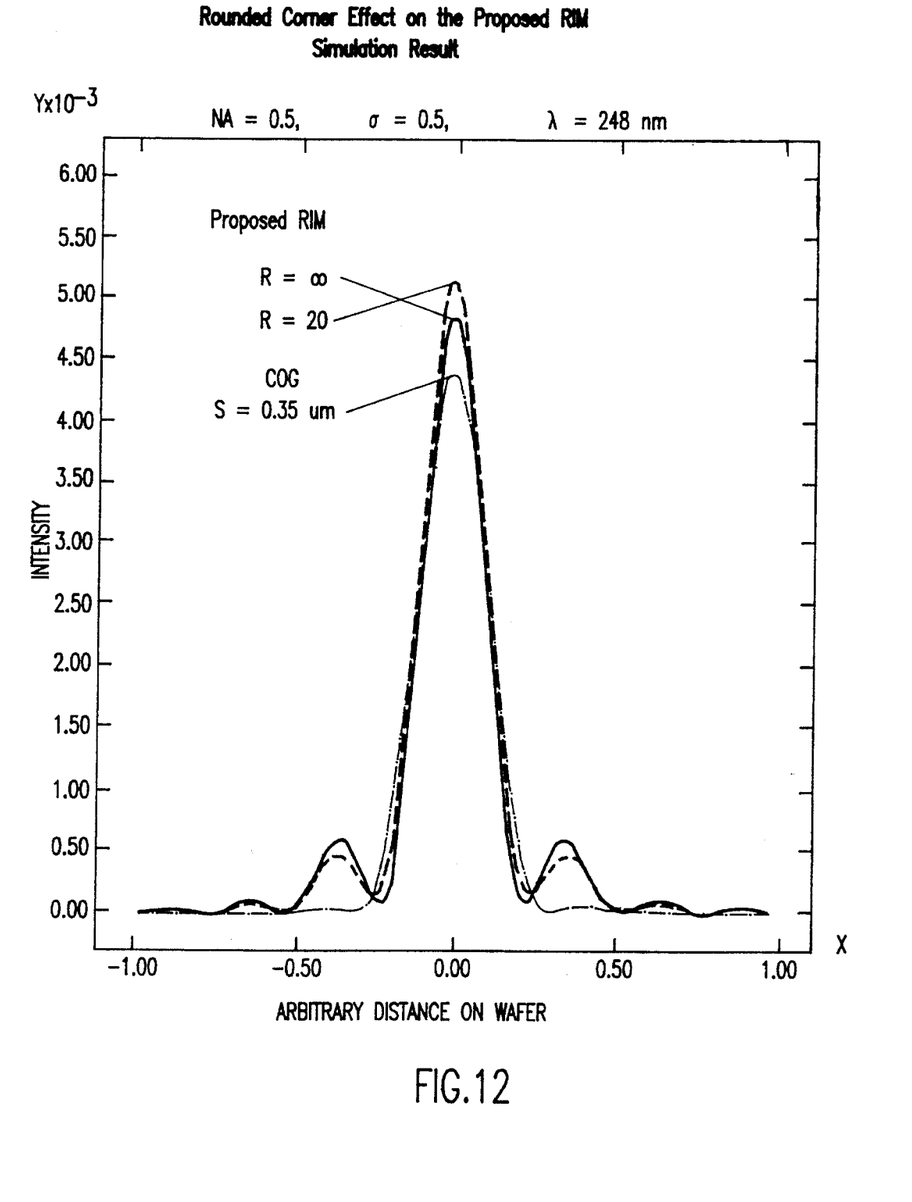
Figure 13:
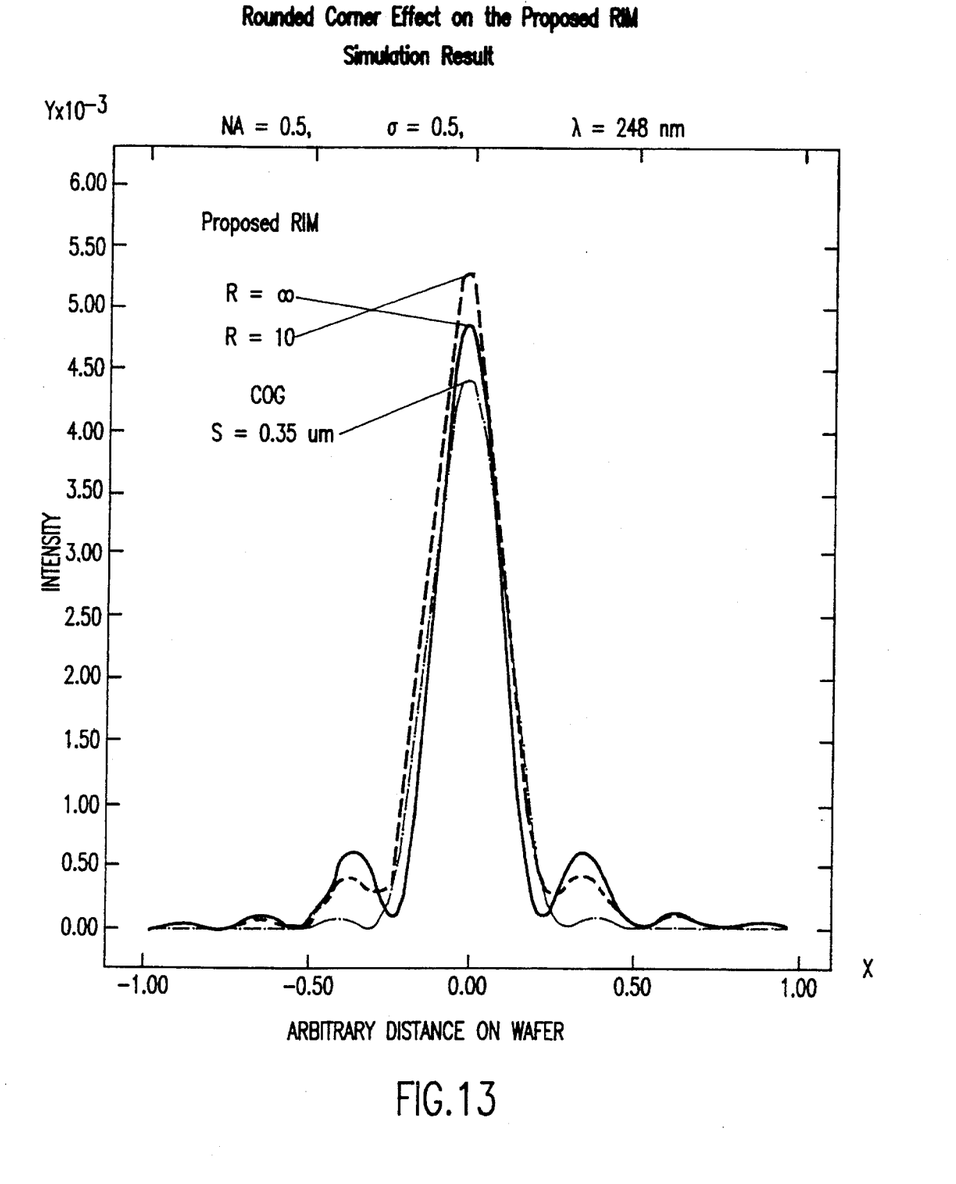
Figure 14:
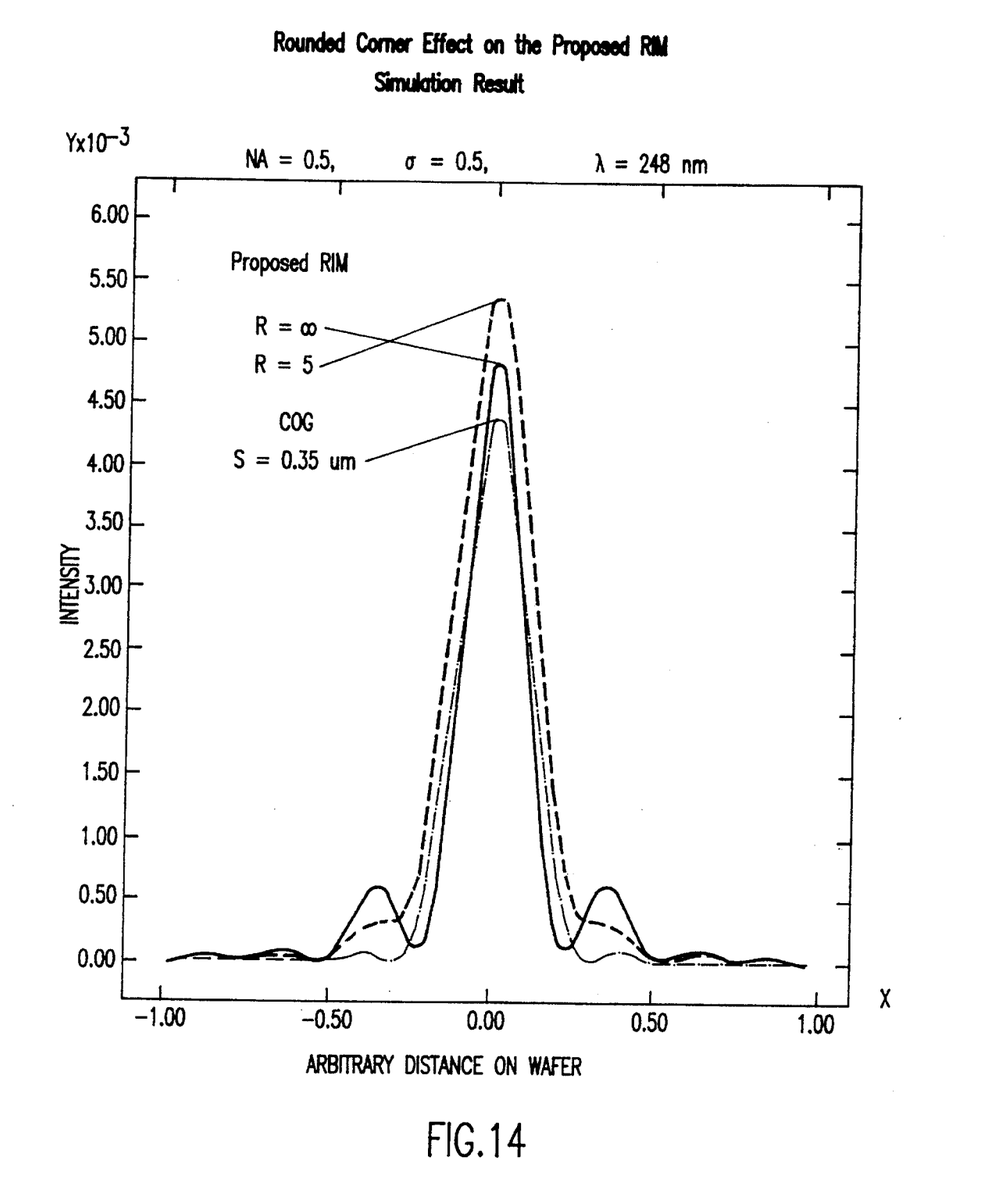
Figure 15:
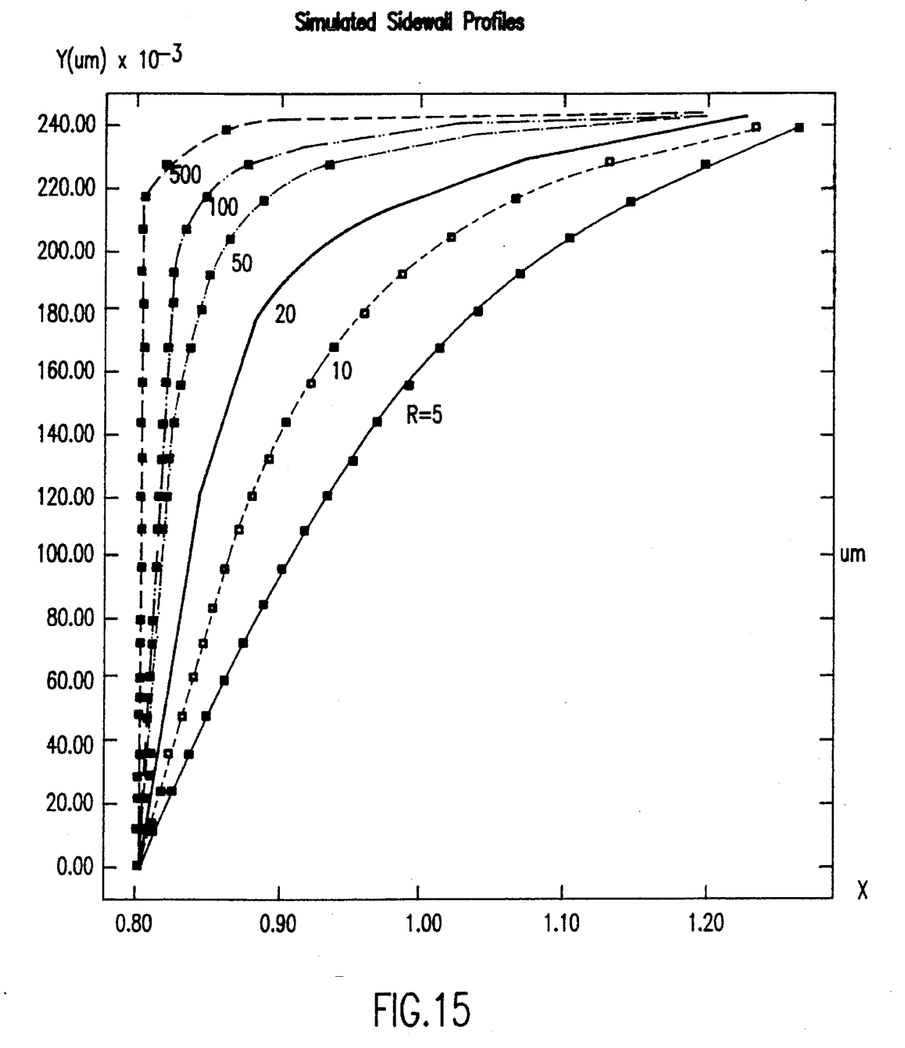
FIG. 15 illustrates profiles of the rim phase-shift structure in accordance with the invention useful for understanding the performance of the invention depicted in FIGS. 7–14.

While the structures shown in FIGS. 3a–5e are depicted in a somewhat idealized form, edges of the phase shift material conformally deposited in accordance with the invention will have a profile which is somewhat sloped or rounded and may be seen in FIG. 6b. For purposes of further simulations to determine the effects of such rounding, a rounding factor, R, was quantified in accordance with a rim phase-shift structure having the dimensions shown in FIG. 6c. The cross-sectional profiles for different values of rounding factor, R, are shown in FIG. 15. It should be noted that in the simulations of FIGS. 7 and 8, an ideal, rectangular profile (e.g. $R=\infty$) was used and it is the purpose of the simulations of FIGS. 9–14 to determine variation therefrom as rounding increases (e.g. R decreases). As can be seen from FIG. 9, a rounding factor of R=500 (which can be achieved) shows virtually no change from the ideal case and much enhanced performance relative to the intensity profile produced by an aperture sized to form an S=0.35 μm exposure feature. From FIGS. 10 and 11, the intensity profile continues to closely approximate the performance of an ideally shaped profile and easily achieved deposit profiles rounded to R=100 and R=50, respectively. At R=20, as shown in FIG. 12, performance of the invention remains far above that of the COG aperture and only reaches the approximate mid-point between ideal performance and the performance of the COG aperture at R=10, as shown in FIG. 13.

It must be remembered, however, that the minimum feature size required in fabrication of the preferred embodiment of the invention is not as small as for the S=0.35 μm aperture and only requires an additional conformal deposit of phase-shift material. Therefore, the additional step approximately balances the difference in manufacturing yields between the two structures and results in a more robust and less easily damaged mask. It is only when R is reduced to 5 that the image sharpness becomes comparable to S=0.35 COG structures while still maintaining some advantage in intensity. Therefore the invention can be produced and will provide advantages over COG structures at about the same total cost over a wide window of process variation.

In view of the foregoing, it is seen that the invention provides a much simplified process for fabricating phase-shift structures for lithography exposure masks which have comparable optical performance to known structures but which can be produced much more inexpensively and at improved manufacturing yields and which are more robust and less susceptible to damage during use. The principles of the invention can also be applied to other phase-shift mask feature structures to enhance the contrast produced thereby.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of fabricating a lithography exposure mask for exposing at least one area and including at least one feature including at least one phase shift region adjacent an opaque region of the mask, said method including the step of patterning a layer of opaque material deposited on a substrate in accordance with said at least one feature wherein said feature corresponds in size to said area and said phase shift region, conformally depositing at least one of a phase shift material and a sidewall spacer material over said opaque material and said substrate, and anisotropically removing a portion of said at least one of a phase shift material and a sidewall spacer material deposited during said conformally depositing step, said portion being limited by an edge of said phase shift region.

2. A method as recited in claim 1, wherein said patterning step is performed by anisotropic reactive ion etching.

3. A method as recited in claim 1, wherein said at least one feature is a closed shape.

4. A method as recited in claim 1, wherein said layer of opaque material is deposited on said substrate to a thickness which is approximately equal to a thickness of said phase shift material which will produce a 180° phase shift of exposure radiation.

5. A method as recited in claim 1, wherein said material deposited during said step of conformally depositing material is sidewall spacer material, said method including the further steps of removing material from said substrate in accordance with said sidewall spacer material and removing said sidewall spacer material.

6. A method as recited in claim 1, including the further steps of applying a resist over said material deposited during said step of conformally depositing material, and patterning said resist.

7. A method as recited in claim 6, wherein said step on patterning said resist includes the step of planarizing a surface of said mask.

8. A method of increasing contrast of a lithography exposure mask having at least one optical feature thereon, said optical feature being at least one of an aperture and a phase shift structure, said method including the steps of depositing a layer of phase-shift material over said at least one optical feature, and establishing a rounding factor of said layer of phase shift material adjacent an edge of at least one said optical feature.

9. A phase-shift lithography mask for projecting at least one image area onto a resist material including a substrate which is substantially transparent to electromagnetic radiation having a desired wavelength and which has a first refractive index, a pattern of opaque material deposited on said substrate and having openings therein exposing said substrate and a feature corresponding in size to said at least one image area formed in at least one of said substrate and a layer of phase shift material which is substantially transparent to electromagnetic radiation having said desired wavelength and which has a second refractive index substantially equal to said first refractive index, said layer of phase shift material being deposited on said substrate, within said openings.

10. A phase-shift lithography mask as recited in claim 9 wherein a thickness of said pattern of opaque material is approximately equal to one-half of a wavelength of said electromagnetic radiation in said layer of phase shift material and wherein said layer of phase shift material is a conformal layer extending over said openings in said opaque material and at least a portion of said opaque material.

11. A phase-shift lithography mask as recited in claim 10 wherein said patterned layer of opaque material defines a Levenson-type phase shifter.

12. A phase-shift lithography mask as recited in claim 10 wherein at least one of said openings in said layer of opaque material is a closed shape.

13. A phase-shift lithography mask as recited in claim 9 wherein said feature corresponding in size to said at least one image shape is a portion of said substrate which is patterned to have a reduced thickness over a central region of one of said openings.

14. A phase shift lithography mask as recited in claim 9 wherein said substrate includes an etch stop layer at a surface thereof and said feature comprises a layer of said phase shift material deposited directly on said etch stop layer.

15. A method of fabricating a lithography exposure mask for exposing at least one area and including at least one feature including at least one phase shift region adjacent an opaque region of the mask, said method including the step of patterning a layer of opaque material deposited on a substrate in accordance with said at least one feature wherein said feature corresponds in size to said area and said phase shift region, conformally depositing a phase shift material over said opaque material and said substrate, and establishing a rounding factor of said phase shift material adjacent an edge of said opaque region.

16. A method as recited in claim 15, wherein said layer of opaque material is deposited on said substrate to a thickness which is approximately equal to a thickness of said phase shift material which will produce a 180° phase shift of exposure radiation.

* * * * *